(12) United States Patent
Kim et al.

(10) Patent No.: US 12,033,583 B2
(45) Date of Patent: Jul. 9, 2024

(54) GATE DRIVER AND DISPLAY DEVICE HAVING THE SAME

(71) Applicant: Samsung Display Co., Ltd., Yongin-si (KR)

(72) Inventors: Jonghee Kim, Yongin-si (KR);
Bogyeong Kim, Seongnam-si (KR);
Tak-Young Lee, Anyang-si (KR);
Boyong Chung, Suwon-si (KR);
Byungseok Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/077,405

(22) Filed: Dec. 8, 2022

(65) Prior Publication Data

US 2023/0402012 A1 Dec. 14, 2023

(30) Foreign Application Priority Data

Jun. 14, 2022 (KR) ........................ 10-2022-0072088

(51) Int. Cl.
*G09G 3/3266* (2016.01)
*G09G 3/3233* (2016.01)
*G09G 3/3275* (2016.01)

(52) U.S. Cl.
CPC ......... *G09G 3/3266* (2013.01); *G09G 3/3233* (2013.01); *G09G 3/3275* (2013.01); *G09G 2300/0426* (2013.01); *G09G 2300/0819* (2013.01); *G09G 2300/0842* (2013.01); *G09G 2310/08* (2013.01); *G09G 2320/0295* (2013.01)

(58) Field of Classification Search
CPC ...... G11C 19/18; G11C 19/28; G09G 3/3677; G09G 3/3674; G09G 3/3266; G09G 2300/0426; G09G 2310/0286; G09G 2310/0267
See application file for complete search history.

(56) References Cited

U.S. PATENT DOCUMENTS 11,127,339 B2 9/2021 Kim et al.
2018/0018920 A1* 1/2018 Kim ..................... G09G 3/3266
(Continued)

FOREIGN PATENT DOCUMENTS

| KR | 1020200041605 A | 4/2020 |
| KR | 1020200072635 A | 6/2020 |
| KR | 102360845 B1 | 2/2022 |

*Primary Examiner* — Chineyere D Wills-Burns
*Assistant Examiner* — Amen W Bogale
(74) *Attorney, Agent, or Firm* — CANTOR COLBURN LLP

(57) ABSTRACT

A gate driver includes stages. Each stage includes: a first output part for outputting a carry signal in response to a voltage of a first node; a first input part for controlling the voltage of the first node in response to a previous carry signal; a second input part for controlling the voltage of the first node in response to a first next carry signal; a second output part for outputting a scan signal in response to the voltage of the first node; a third output part for outputting a sensing signal in response to the voltage of the first node; and a scan signal control part for applying a first low power voltage to an output terminal of the second output part to which the scan signal is output in response to a second next carry signal of which a pulse is generated before the first next carry signal.

18 Claims, 9 Drawing Sheets

(56) References Cited

U.S. PATENT DOCUMENTS

| | | | |
|---|---|---|---|
| 2020/0219451 A1* | 7/2020 | Kim | G09G 3/3266 |
| 2020/0349888 A1* | 11/2020 | Park | G09G 3/3275 |
| 2020/0372851 A1* | 11/2020 | Kim | G09G 3/2092 |
| 2021/0056908 A1* | 2/2021 | Park | G09G 3/3275 |
| 2021/0201767 A1 | 7/2021 | Park et al. | |
| 2022/0108656 A1* | 4/2022 | Lee | G09G 3/3275 |

* cited by examiner

GATE DRIVER AND DISPLAY DEVICE HAVING THE SAME

This application claims priority to Korean Patent Application No. 10-2022-0072088, filed on Jun. 14, 2022, and all the benefits accruing therefrom under 35 U.S.C. § 119, the content of which in its entirety is herein incorporated by reference.

BACKGROUND

1. Field

Embodiments of the present invention relate to a gate driver and a display device having the gate driver. More particularly, embodiments of the present invention relate to a gate driver for reducing a falling time of a scan signal and a display device having the gate driver.

2. Description of the Related Art

Generally, a display device may include a display panel, a timing controller, a gate driver, and a data driver. The display panel may include a plurality of gate lines, a plurality of data lines, and a plurality of pixels electrically connected to the gate lines and the data lines. The gate driver may provide gate signals to the gate lines. The data driver may provide data voltages to the data lines. The timing controller may control the gate driver and the data driver.

The data voltages may be written to the pixels in response to scan signals included in the gate signals. The gate driver may sequentially output the scan signals to the gate lines. In this case, when the scan signals output to different gate lines overlap, the data voltages may not be accurately written to pixels connected to each gate line.

SUMMARY

Embodiments of the present invention provide a gate driver reducing a falling time of a scan signal.

Embodiments of the present invention also provide a display device having a gate driver reducing a falling time of a scan signal.

According to embodiments of the present invention, a gate driver includes: a plurality of stages, and each of the stages includes: a first output part configured to output a carry signal in response to a voltage of a first node; a first input part configured to control the voltage of the first node in response to a previous carry signal; a second input part configured to control the voltage of the first node in response to a first next carry signal; a second output part configured to output a scan signal in response to the voltage of the first node, a third output part configured to output a sensing signal in response to the voltage of the first node, and a scan signal control part configured to apply a first low power voltage to an output terminal of the second output part to which the scan signal is output in response to a second next carry signal of which a pulse is generated before a pulse of the first next carry signal.

In an embodiment, the scan signal control part may include a first transistor including a control electrode configured to receive the second next carry signal, a first electrode configured to receive the first low power voltage, and a second electrode connected to the output terminal of the second output part.

In an embodiment, the first output part may include: a 2-1th transistor including a control electrode connected to the first node, a first electrode configured to receive a carry clock signal, and a second electrode connected to an output terminal of the first output part, and a 2-2th transistor including a control electrode connected to a second node, a first electrode configured to receive a second low power voltage, and a second electrode connected to the output terminal of the first output part, the second output part may include a 3-1th transistor including a control electrode connected to the first node, a first electrode configured to receive a scan clock signal, and a second electrode connected to the output terminal of the second output part, and a 3-2th transistor including a control electrode connected to the second node, a first electrode configured to receive the first low power voltage, and a second electrode connected to the output terminal of the second output part, and the third output part may include a 4-1th transistor including a control electrode connected to the first node, a first electrode configured to receive a sensing clock signal, and a second electrode connected to an output terminal of the third output part, and a 4-2th transistor including a control electrode connected to the second node, a first electrode configured to receive the first low power voltage, and a second electrode connected to the output terminal of the third output part.

In an embodiment, the output terminal of the first output part may be not connected to a transistor other than the 2-1th transistor and the 2-2th transistor, and the output terminal of the third output part may be not connected to a transistor other than the 4-1th transistor and the 4-2th transistor.

In an embodiment, the first low power voltage may be greater than the second low power voltage.

In an embodiment, the second output part may further include a first capacitor including a first electrode connected to the first node and a second electrode connected to the output terminal of the second output part, and the third output part may further include a second capacitor including a first electrode connected to the first node and a second electrode connected to the output terminal of the third output part.

In an embodiment, the first input part includes a 5-1th transistor including a control electrode configured to receive the previous carry signal, a first electrode configured to receive the previous carry signal, and a second electrode connected to a third node, and a 5-2th transistor including a control electrode configured to receive the previous carry signal, a first electrode connected to the third node, and a second electrode connected to the first node, the second input part may include a 6-1th transistor including a control electrode configured to receive the first next carry signal, a first electrode connected to the third node, and a second electrode connected to the first node, and a 6-2th transistor including a control electrode configured to receive the first next carry signal, a first electrode configured to receive the second low power voltage, and a second electrode connected to the third node.

In an embodiment, each of the stages may further include a first control part configured to control a voltage of the second node in response to the voltage of the first node, a second control part configured to control the voltage of the first node in response to the voltage of the second node, and a third control part configured to control the voltage of the second node in response to the previous carry signal.

In an embodiment, each of the stages may further include a fourth control part configured to control the voltage of the first node in response to a start signal. In an embodiment, the first control part may include a 7-1th transistor including a control electrode configured to receive a first scan control signal, a first electrode configured to receive the first scan control signal, and a second electrode connected to a first electrode of a 7-2th transistor, the 7-2th transistor including a control electrode configured to receive the first scan control signal, the first electrode connected to the second electrode of the 7-1th transistor, and a second electrode connected to a fourth node, an eighth transistor including a control electrode connected to the fourth node, a first electrode configured to receive the first scan control signal, and a second electrode connected to the second node, a ninth transistor including a control electrode connected to the first node, a first electrode configured to receive a third low power voltage, and a second electrode connected to the fourth node, and a tenth transistor including a control electrode connected to the first node, a first electrode configured to receive the second low power voltage, and a second electrode connected to the second node.

In an embodiment, the third low power voltage may be the same as the first low power voltage.

In an embodiment, the first scan control signal may be a gate-on voltage.

In an embodiment, the second control part may include an 11-1th transistor including a control electrode connected to the second node, a first electrode connected to the third node, and a second electrode connected to the first node, and an 11-2th transistor including a control electrode connected to the second node, a first electrode configured to receive the second low power voltage, and a second electrode connected to the third node, the third control part may include a twelfth transistor including a control electrode configured to receive the previous carry signal, a first electrode configured to receive the second low power voltage, and a second electrode connected to the second node, and the fourth control part may include a 13-1th transistor including a control electrode configured to receive the start signal, a first electrode connected to the third node, and a second electrode connected to the first node, and a 13-2th transistor including a control electrode configured to receive the start signal, a first electrode configured to receive the second low power voltage, and a second electrode connected to the third node.

In an embodiment, each of the stages may further include a leakage control part configured to apply a second scan control signal to the third node in response to the voltage of the first node.

In an embodiment, the second scan control signal may be a gate-on voltage.

In an embodiment, the leakage control part may include a 14-1th transistor including a control electrode connected to the first node, a first electrode configured to receive the second scan control signal, and a second electrode connected to a first electrode of a 14-2th transistor, and the 14-2th transistor including a control electrode connected to the first node, the first electrode connected to the second electrode of the 14-1th transistor, and a second electrode connected to the third node.

In an embodiment, at least one of the stages may be selected, and each of the stages may include a sensing circuit configured to apply a gate-on voltage to the first node of the selected stage in a blank period.

In an embodiment, an on-duty ratio of the scan signal may be smaller than an on-duty ratio of the sensing signal.

According to embodiments of the present invention, a display device includes: a display panel including pixels connected to data lines, a gate driver including a plurality of stages, a data driver configured to apply data voltages to the pixels, and a timing controller configured to control the gate driver and the data driver. Each of the stages includes: a first output part configured to output a carry signal in response to a voltage of a first node; a first input part configured to control the voltage of the first node in response to a previous carry signal; a second input part configured to control the voltage of the first node in response to a first next carry signal; a second output part configured to output a scan signal in response to the voltage of the first node; a third output part configured to output a sensing signal in response to the voltage of the first node; and a scan signal control part configured to apply a first low power voltage to an output terminal of the second output part to which the scan signal is output in response to a second next carry signal of which a pulse is generated before a pulse of the first next carry signal.

In an embodiment, each of the pixels includes: a driving transistor including a control electrode connected to a fifth node, a first electrode configured to receive a first power voltage, and a second electrode connected to a sixth node, a write transistor including a control electrode configured to receive the scan signal, a first electrode configured to receive a corresponding data voltage of the data voltages, and a second electrode connected to the fifth node, a sensing transistor including a control electrode configured to receive the sensing signal, a first electrode connected to a sensing line, and a second electrode connected to the sixth node, a storage capacitor including a first electrode connected to the fifth node and a second electrode connected to the sixth node, and a light emitting element including a first electrode connected to the sixth node and a second electrode configured to receive a second power voltage.

Therefore, the gate driver may reduce a falling time of a scan signal by including each of stages including a first input part configured to control a voltage of a first node in response to a previous carry signal, a second input part configured to control the voltage of the first node in response to a first next carry signal, a first output part configured to output a carry signal in response to the voltage of the first node, a second output part configured to output the scan signal in response to the voltage of the first node, a third output part configured to output a sensing signal in response to the voltage of the first node, and a scan signal control part configured to apply a first low power voltage to an output terminal of the second output part to which the scan signal is output in response to a second next carry signal of which a pulse is generated before a pulse of the first next carry signal.

In addition, the display device may effectively reduce an overlapping time of a scan signal output to different gate lines by including a gate driver reducing a falling time of the scan signal.

Further, the gate driver may effectively reduce a dead space and process defects by including a transistor for reducing a falling time of a scan signal, and not including a transistor for reducing a falling time of a sensing signal and/or a carry signal.

However, the effects of the present invention are not limited to the above-described effects, and may be variously expanded without departing from the spirit and scope of the present invention.

DETAILED DESCRIPTION

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, the present invention will be explained in detail with reference to the accompanying drawings.

Figure 1:
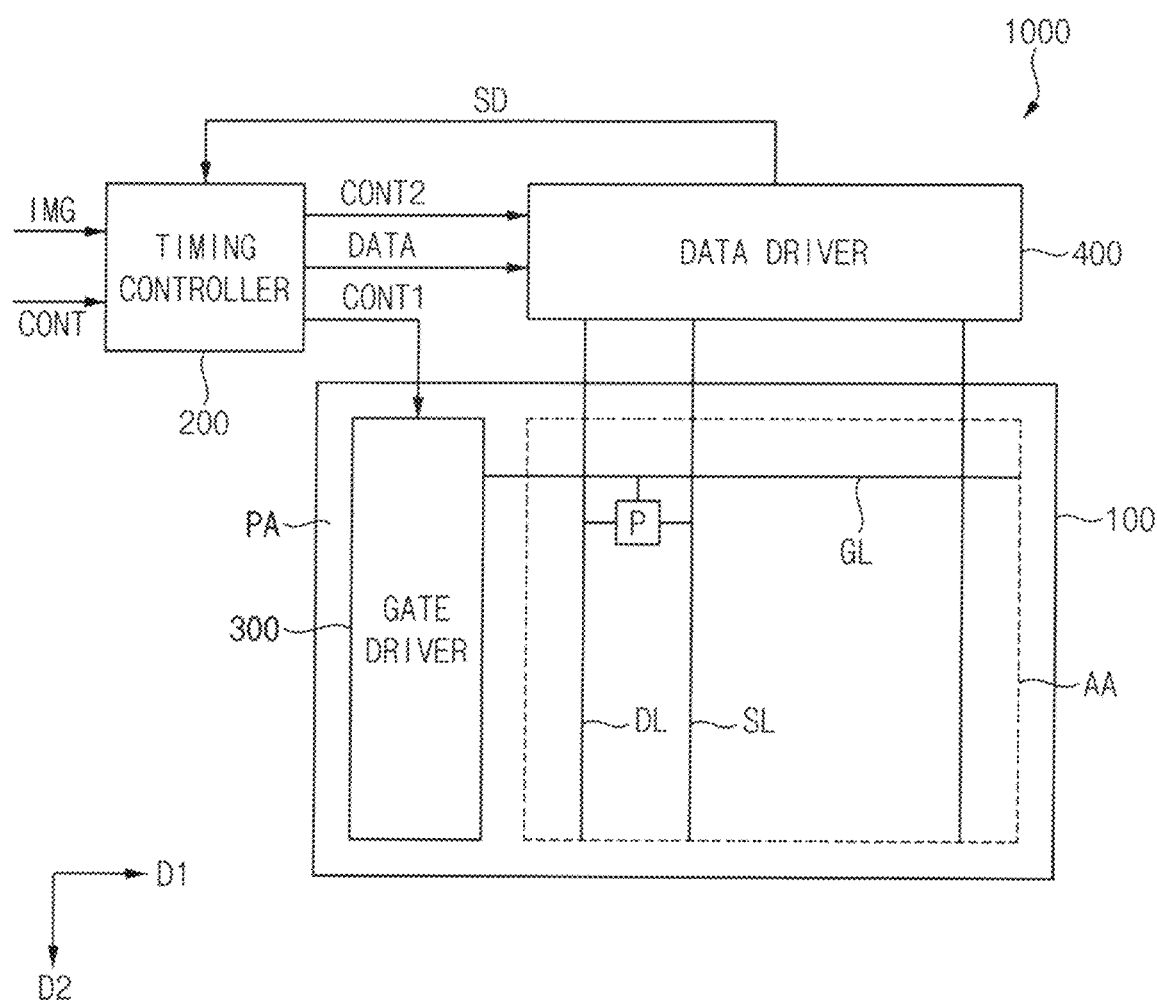
FIG. 1 is a block diagram illustrating a display device according to embodiments of the present invention.

FIG. 1 is a block diagram illustrating a display device 1000 according to embodiments of the present invention.

Referring to FIG. 1, the display device 1000 may include a display panel 100, a timing controller 200, a gate driver 300, and a data driver 400. In an embodiment, the timing controller 200 and the data driver 400 may be integrated into one chip.

The display panel 100 has a display region AA on which an image is displayed and a peripheral region PA adjacent to the display region AA. In an embodiment, the gate driver 300 may be mounted on the peripheral region PA of the display panel 100.

The display panel 100 may include a plurality of gate lines GL, a plurality of data lines DL, a plurality of sensing lines SL, and a plurality of pixels P electrically connected to the data lines DL, the gate lines GL, and the sensing lines SL. The gate lines GL may extend in a first direction D1 and the data lines DL and the sensing lines SL may extend in a second direction D2 crossing the first direction D1.

The timing controller 200 may receive input image data IMG and an input control signal CONT from a host processor (e.g., a graphic processing unit; "GPU"). For example, the input image data IMG may include red image data, green image data and blue image data. In an embodiment, the input image data IMG may further include white image data. For another example, the input image data IMG may include magenta image data, yellow image data, and cyan image data. The input control signal CONT may include a master clock signal and a data enable signal. The input control signal CONT may further include a vertical synchronizing signal and a horizontal synchronizing signal.

The timing controller 200 may generate a first control signal CONT1, a second control signal CONT2, and data signal DATA based on the input image data IMG and the input control signal CONT.

The timing controller 200 may generate the first control signal CONT1 for controlling operation of the gate driver 300 based on the input control signal CONT and output the first control signal CONT1 to the gate driver 300. The first control signal CONT1 may include a vertical start signal and a gate clock signal.

The timing controller 200 may generate the second control signal CONT2 for controlling operation of the data driver 400 based on the input control signal CONT and output the second control signal CONT2 to the data driver 400. The second control signal CONT2 may include a horizontal start signal and a load signal.

The timing controller 200 may receive the input image data IMG and the input control signal CONT, and generate the data signal DATA. The timing controller 200 may output the data signal DATA to the data driver 400.

The gate driver 300 may generate gate signals for driving the gate lines GL in response to the first control signal CONT1 input from the timing controller 200. The gate driver 300 may output the gate signals to the gate lines GL. For example, the gate driver 300 may sequentially output the gate signals to the gate lines GL.

The data driver 400 may receive the second control signal CONT2 and the data signal DATA from the timing controller 200. The data driver 400 may convert the data signal DATA into data voltages having an analog type. The data driver 400 may output the data voltage to the data lines DL.

The data driver 400 may generate sensing data SD by sensing the pixels P (e.g., sensing a threshold voltage and a mobility characteristic of a driving transistor of each of the pixels P). The data driver 400 may output the sensing data SD to the timing controller 200. The timing controller 200 may compensate for the input image data IMG based on the sensing data SD.

Figure 2:
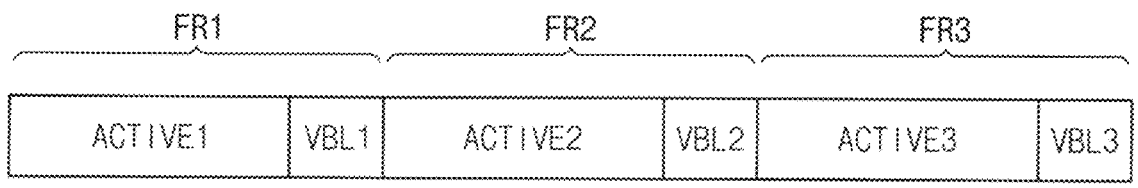
FIG. 2 is a conceptual diagram illustrating a driving timing of the display device of FIG. 1.

FIG. 2 is a conceptual diagram illustrating a driving timing of the display device 1000 of FIG. 1.

Referring to FIGS. 1 and 2, the display device 1000 may be driven in units of a frame. The frame FR1, FR2, and FR3 may include an active period ACTIVE1, ACTIVE2, and ACTIVE3 and a blank period VBL1, VBL2, and VBL3. The data voltages may be written to the pixels P of the display panel 100 in the active period ACTIVE1, ACTIVE2, and ACTIVE3. The data voltages may not be written to the pixels P of the display panel 100 in the blank period VBL1, VBL2, and VBL3.

Figure 8:
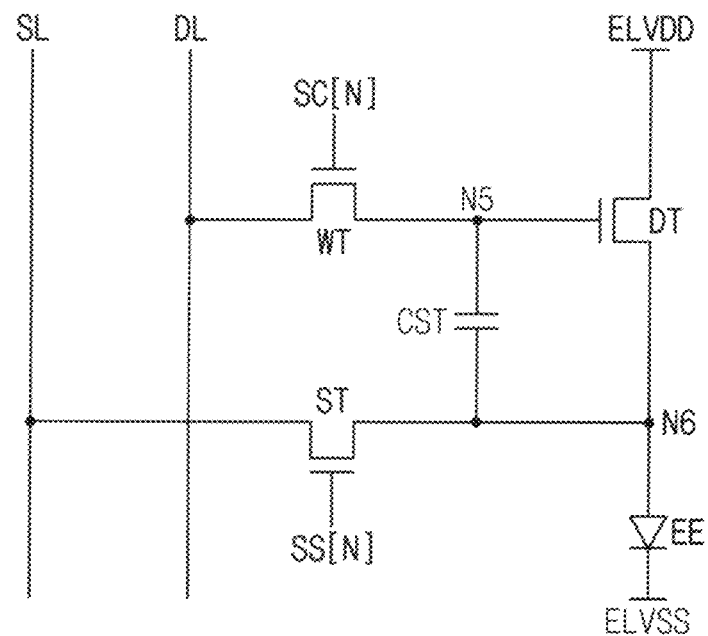
FIG. 8 is a diagram illustrating an example of a pixel of the display device of FIG. 1.

For example, a sensing operation (i.e., generating the sensing data SD based on a signal of a sixth node N6 of FIG. 8) may be performed in the blank period VBL1, VBL2, and VBL3. For example, the sensing data SD may be generated in a first blank period VBL1, and the data voltages compensated for in a second active period ACTIVE2 based on the sensing data SD generated in the first blank period VBL1 may be written to the pixels P. For example, the sensing data SD may be generated in a second blank period VBL2, and the data voltages compensated for in a third active period ACTIVE3 based on the sensing data SD generated in the second blank period VBL2 may be written to the pixels P.

Figure 3:
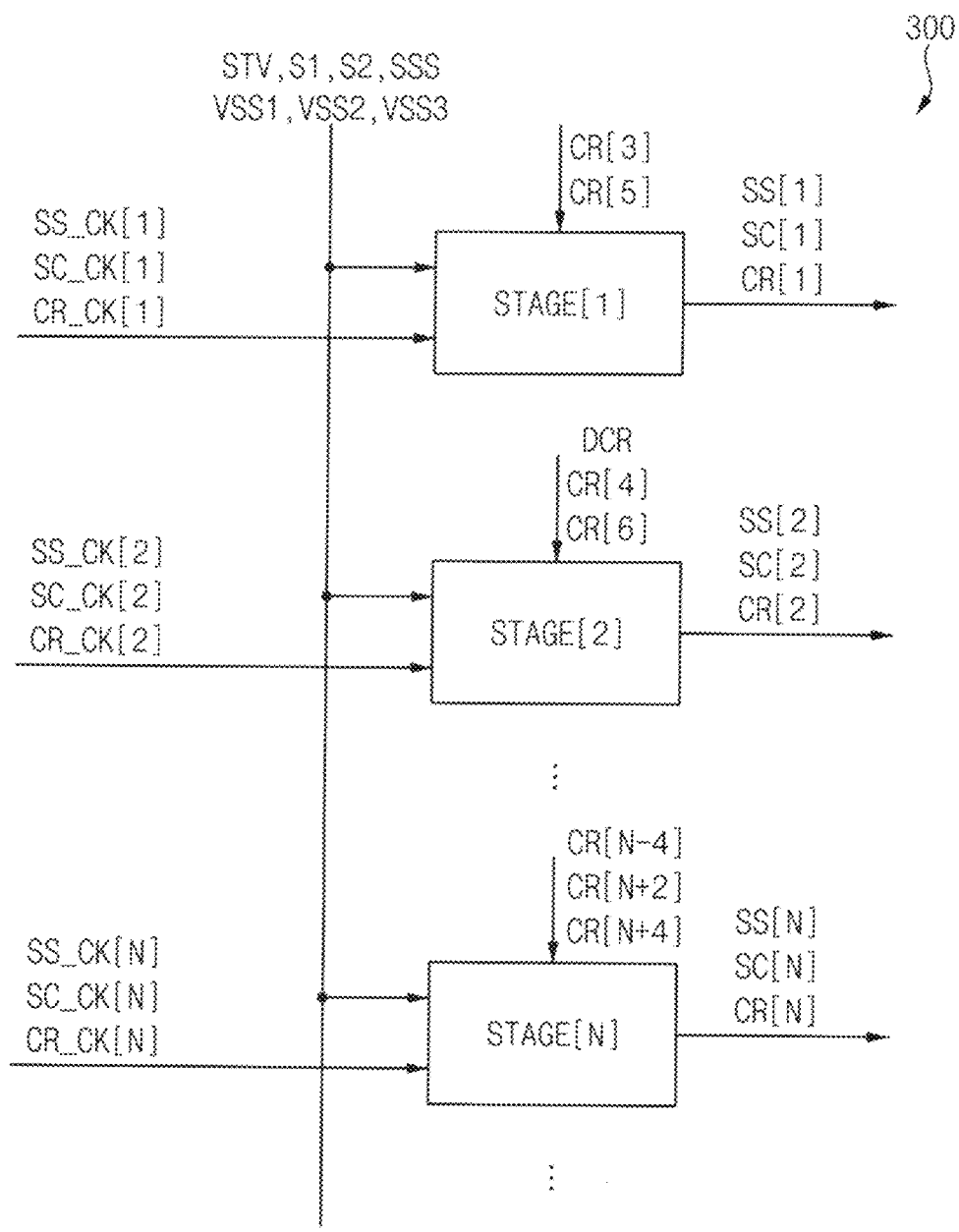
FIG. 3 is a diagram illustrating an example of a gate driver of the display device of FIG. 1.

FIG. 3 is a diagram illustrating an example of the gate driver 300 of the display device 1000 of FIG. 1.

Referring to FIG. 3, the gate driver 300 may include a plurality of stages (STAGE[1], STAGE[2], ..., STAGE[N], ...). The gate signals may include scan signals (SC[1], SC[2], ..., SC[N], ...) and sensing signals (SS[1], SS[2], ..., SS[N], ...). Here, N is any positive integer.

The stages (STAGE[1], STAGE[2], ..., STAGE[N], ...) may generate the scan signals (SC[1], SC[2], ..., SC[N], ...) based on scan clock signals (SC_CK[1], SC_CK[2], ..., SC_CK[N], ...). For example, a first stage STAGE[1] may generate a first scan signal SC[1] based on a first scan clock signal SC_CK[1]. For example, an N-th stage STAGE[N] may generate an N-th scan signal SC[N] based on an N-th scan clock signal SC_CK[N].

The stages (STAGE[1], STAGE[2], ..., STAGE[N], ...) may generate the sensing signals (SS[1], SS[2], ..., SS[N], ...) based on the sensing clock signals (SS_CK[1], SS_CK[2], ..., SS_CK[N], ...). For example, the first stage STAGE[1] may generate a first sensing signal SS[1] based on a first sensing clock signal SC_CK[1]. For example, the N-th stage STAGE[N] may generate an N-th sensing signal SS[N] based on an N-th sensing clock signal SS_CK[N].

The stages (STAGE[1], STAGE[2], ..., STAGE[N], ...) may generate carry signals (CR[1], CR[2], ..., CR[N], ...) based on carry clock signals (CR_CK[1], CR_CK[2], ..., CR_CK[N], ...). For example, the first stage STAGE[1] may generate a first carry signal CR[1] based on a first carry clock signal CR_CK[1]. For example, an N-th stage STAGE[N] may generate an N-th carry signal CR[N] based on an N-th carry clock signal CR_CK[N].

The stages (STAGE[1], STAGE[2], ..., STAGE[N], ...) may generate the scan signals (SC[1], SC[2], ..., SC[N], ...), the sensing signals (SS[1], SS[2], ..., SS[N], ...), and the carry signals (CR[1], CR[2], ..., CR[N], ...) based on a start signal STV, a first scan control signal S1, a second scan control signal S2, a sensing selection signal SSS, a first low power voltage VSS1, a second low power voltage VSS2, and a third low power voltage VSS3.

The stages (STAGE[1], STAGE[2], ..., STAGE[N], ...) may generate the scan signals (SC[1], SC[2], ..., SC[N], ...), the sensing signals (SS[1], SS[2], ..., SS[N], ...), and the carry signals (CR[1], CR[2], ..., CR[N], ...) based on previous carry signals (e.g., CR[N−4] relative to the N-th stage (STAGE[N])). The first stage STAGE[1] may generate the first scan signal SC[1], the first sensing signal SS[1], and the first carry signal CR[1] based on the start signal STV instead of the previous carry signal. However, Stages (e.g., STAGE[2]) that cannot receive the previous carry signal except for the first stage (STAGE[1]) may generate the scan signal (e.g., SC[2]), the sensing signal (e.g., SS[2]), and the carry signal (e.g., CR[2]) based on a dummy carry signal DCR.

Figure 4:
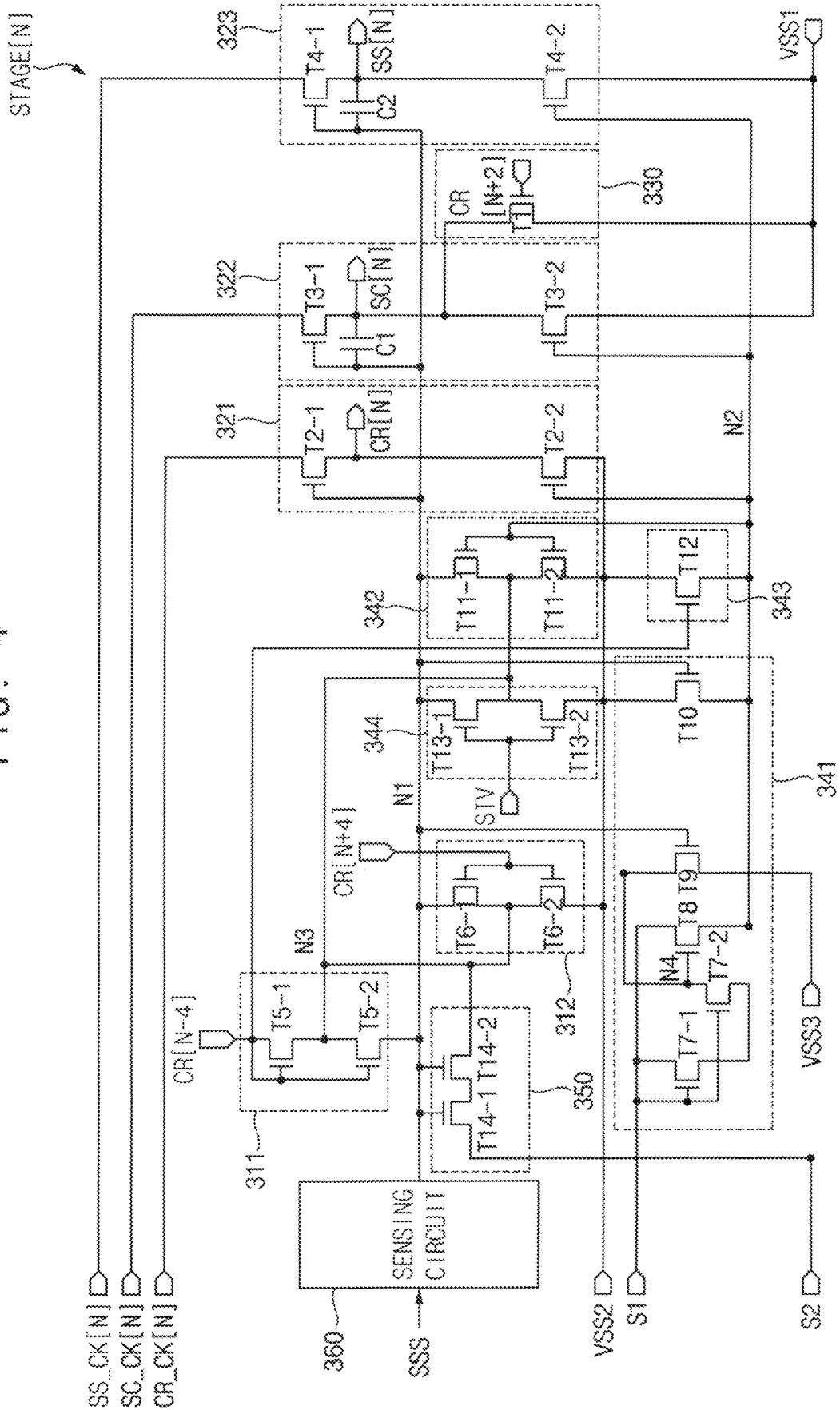
FIG. 4 is a diagram illustrating an example of a stage of the display device of FIG. 1.
Figure 5:
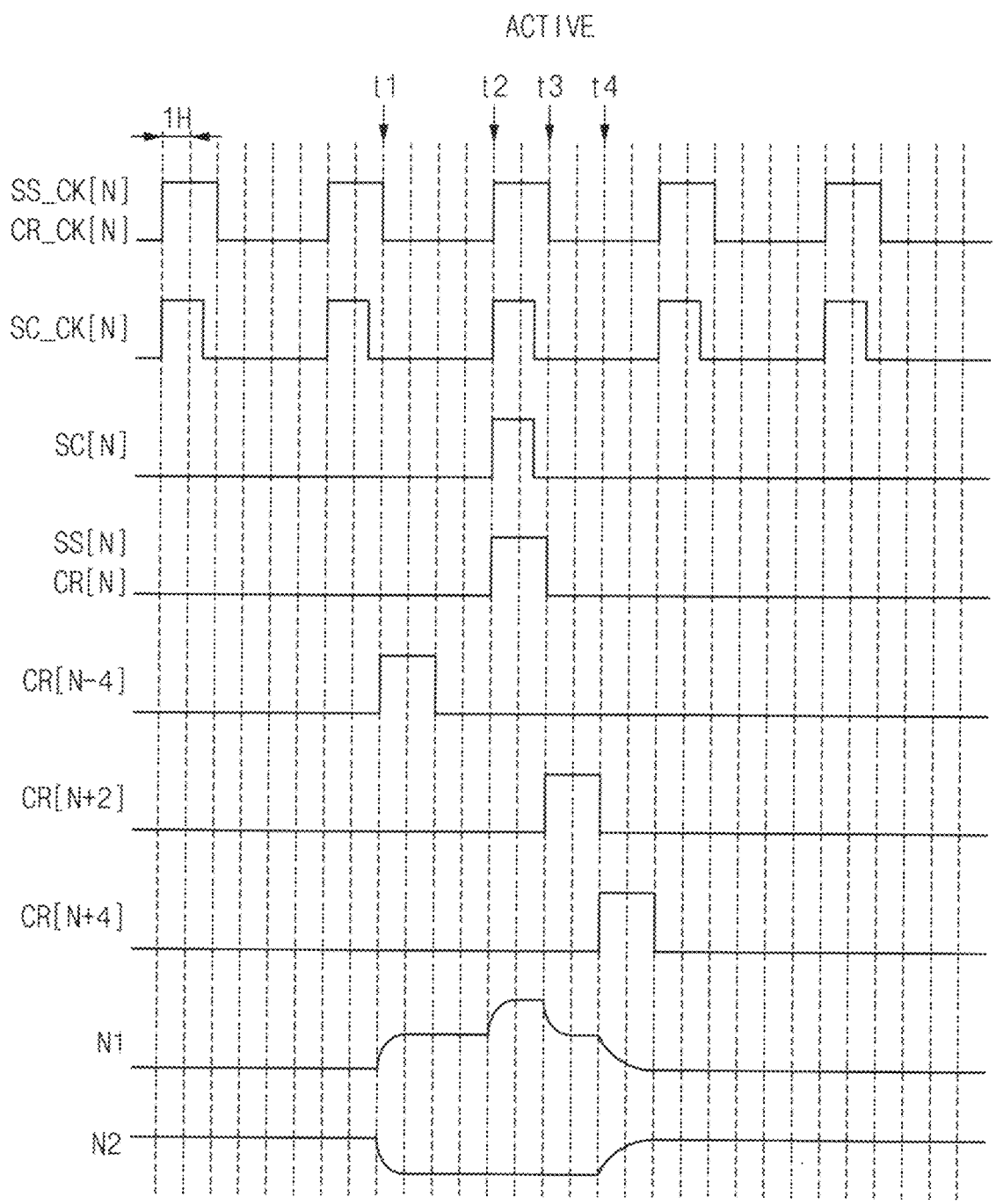
FIG. 5 is a timing diagram illustrating an example in which the display device of FIG. 1 operates in an active period.
Figure 6:
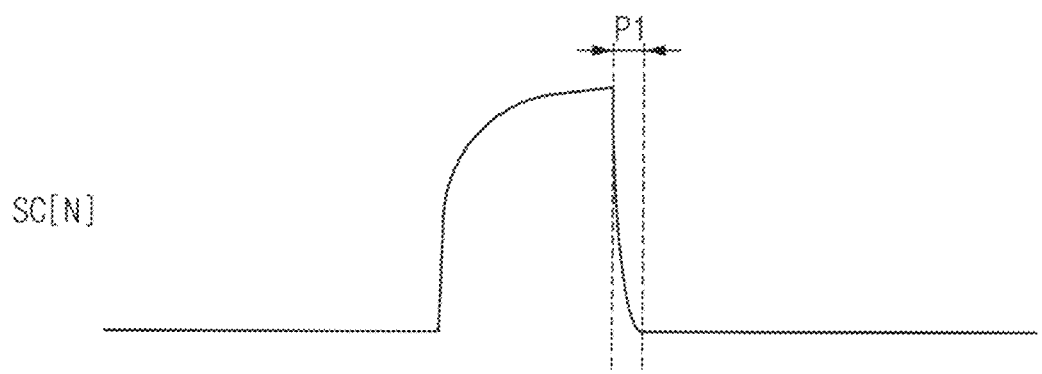
FIG. 6 is a diagram illustrating an example of a scan signal and a sensing signal of the display device of FIG. 1.
Figure 6:
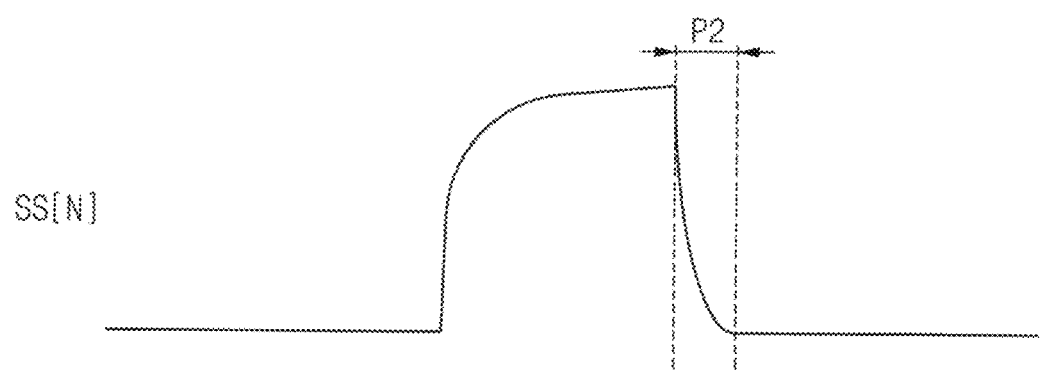

FIG. 4 is a diagram illustrating an example of the stage STAGE[N] of the display device 1000 of FIG. 1, FIG. 5 is a timing diagram illustrating an example in which the display device 1000 of FIG. 1 operates in the active period ACTIVE, and FIG. 6 is a diagram illustrating an example of the scan signal SC[N] and the sensing signal SS[N] of the display device 1000 of FIG. 1. FIGS. 5 and 6 illustrate a gate-on level as a high voltage level and a gate-off level as a low voltage level. Hereinafter, description will be made based on the N-th stage STAGE[N].

Referring to FIG. 4, the stage STAGE[N] may include a first input part 311 for controlling a voltage of a first node N1 in response to a previous carry signal CR[N−4], a second input part 312 for controlling the voltage of the first node N1 in response to a first next carry signal CR[N+4], a first output part 321 for outputting the carry signal CR[N] in response to the voltage of the first node N1, a second output part 322 for outputting the scan signal SC[N] in response to the voltage of the first node N1, a third output part 323 for outputting the sensing signal SS[N] in response to the voltage of the first node N1, and a scan signal control part 330 for applying the first low power voltage VSS1 to an output terminal of the second output part 322 to which the scan signal SC[N] is output in response to a second next carry signal CR[N+2] of which a pulse is generated before a pulse of the first next carry signal CR[N+4].

For example, the scan signal control part 330 may include a first transistor T1 including a control electrode for receiving the second next carry signal CR[N+2], a first electrode for receiving the first low power voltage VSS1, and a second electrode connected to the output terminal of the second output part 322.

For example, the first output part 321 may include a 2-1th transistor T2-1 including a control electrode connected to the first node N1, a first electrode for receiving the carry clock signal CR_CK[N], and a second electrode connected to an output terminal of the first output part 321, and a 2-2th transistor T2-2 including a control electrode connected to a second node N2, a first electrode for receiving the second low power voltage VSS2, and a second electrode connected to the output terminal of the first output part 321.

For example, the second output part 322 may include a 3-1th transistor T3-1 including a control electrode connected to the first node N1, a first electrode for receiving the scan clock signal SC_CK[N], and a second electrode connected to the output terminal of the second output part 322, and a 3-2th transistor T3-2 including a control electrode connected to the second node N2, a first electrode for receiving the first low power voltage VSS1, and a second electrode connected to the output terminal of the second output part 322. For example, the second output part 322 may further include a first capacitor C1 including a first electrode connected to the first node N1 and a second electrode connected to the output terminal of the second output part 322.

For example, the third output part 323 may include a 4-1th transistor T4-1 including a control electrode connected to the first node N1, a first electrode for receiving the sensing clock signal SS_CK[N], and a second electrode connected to an output terminal of the third output part 323, and a 4-2th transistor T4-2 including a control electrode connected to the second node N2, a first electrode for receiving the first low power voltage VSS1, and a second electrode connected to the output terminal of the third output part 323. For example, the third output part 323 may further include a second capacitor C2 including a first electrode connected to the first node N1 and a second electrode connected to the output terminal of the third output part 323.

For example, the first input part 311 may include a 5-1th transistor T5-1 including a control electrode for receiving the previous carry signal CR[N−4], a first electrode for receiving the previous carry signal CR[N−4], and a second electrode connected to a third node N3, and a 5-2th transistor T5-2 including a control electrode for receiving the previous carry signal CR[N−4], a first electrode connected to the third node N3, and a second electrode connected to the first node N1.

For example, the second input part 312 may include a 6-1th transistor T6-1 including a control electrode for receiving the first next carry signal CR[N+4], a first electrode connected to the third node N3, and a second electrode connected to the first node N1, and a 6-2th transistor T6-2 including a control electrode for receiving the first next carry signal CR[N+4], a first electrode for receiving a second low power voltage VSS2, and a second electrode connected to the third node N3.

In an embodiment, the stage STAGE[N] may further include a first control part 341 for controlling a voltage of the second node N2 in response to the voltage of the first node N1, a second control part 342 for controlling the voltage of the first node N1 in response to the voltage of the second node N2, and a third control part 343 for controlling the voltage of the second node N2 in response to the previous carry signal CR[N−4]. In an embodiment, the stage STAGE[N] may further include a fourth control part 344 for controlling the voltage of the first node N1 in response to the start signal STV.

For example, the first control part 341 may include a 7-1th transistor T7-1 including a control electrode for receiving a first scan control signal S1, a first electrode for receiving the first scan control signal S1, and a second electrode connected to a first electrode of a 7-2th transistor T7-2, the 7-2th transistor T7-2 including a control electrode for receiving the first scan control signal S1, the first electrode connected to the second electrode of the 7-1th transistor T7-1, and a second electrode connected to a fourth node N4, an eighth transistor T8 including a control electrode connected to the fourth node N4, a first electrode for receiving the first scan control signal S1, and a second electrode connected to the second node N2, a ninth transistor T9 including a control electrode connected to the first node N1, a first electrode for receiving the third low power voltage VSS3, and a second electrode connected to the fourth node N4, and a tenth transistor T10 including a control electrode connected to the first node N1, a first electrode for receiving the second low power voltage VSS2, and a second electrode connected to the second node N2.

For example, the second control part 342 may include an 11-1th transistor T11-1 including a control electrode connected to the second node N2, a first electrode connected to the third node N3, and a second electrode connected to the first node N1, and an 11-2th transistor T11-2 including a control electrode connected to the second node N2, a first electrode for receiving the second low power voltage VSS2, and a second electrode connected to the third node N3.

For example, the third control part 343 may include a twelfth transistor T12 including a control electrode for receiving the previous carry signal CR[N−4], a first electrode for receiving the second low power voltage VSS2, and a second electrode connected to the second node N2.

For example, the fourth control part 344 may include a 13-1th transistor T13-1 including a control electrode for receiving the start signal STV, a first electrode connected to the third node N3, and a second electrode connected to the first node N1, and a 13-2th transistor T13-2 including a control electrode for receiving the start signal STV, a first electrode for receiving the second low power voltage VSS2, and a second electrode connected to the third node N3.

In an embodiment, the stage STAGE[N] may further include a leakage control part 350 for applying a second scan control signal S2 to the third node N3 in response to the voltage of the first node N1.

For example, the leakage control part 350 may include a 14-1th transistor T14-1 including a control electrode connected to the first node N1, a first electrode for receiving the second scan control signal S2, and a second electrode connected to the first electrode of a 14-2th transistor T14-2, and the 14-2th transistor T14-2 including a control electrode connected to the first node N1, the first electrode connected to the second electrode of the 14-1th transistor T14-1, and a second electrode connected to the third node N3.

In an embodiment, transistors included in the stage STAGE[N] may be n-type transistors. Accordingly, the gate-on level may be the high voltage level, and the gate-off level may be the low voltage level. However, the present invention is not limited thereto. For example, the transistors included in the stage STAGE[N] may be p-type transistors in another embodiment.

Figure 7:
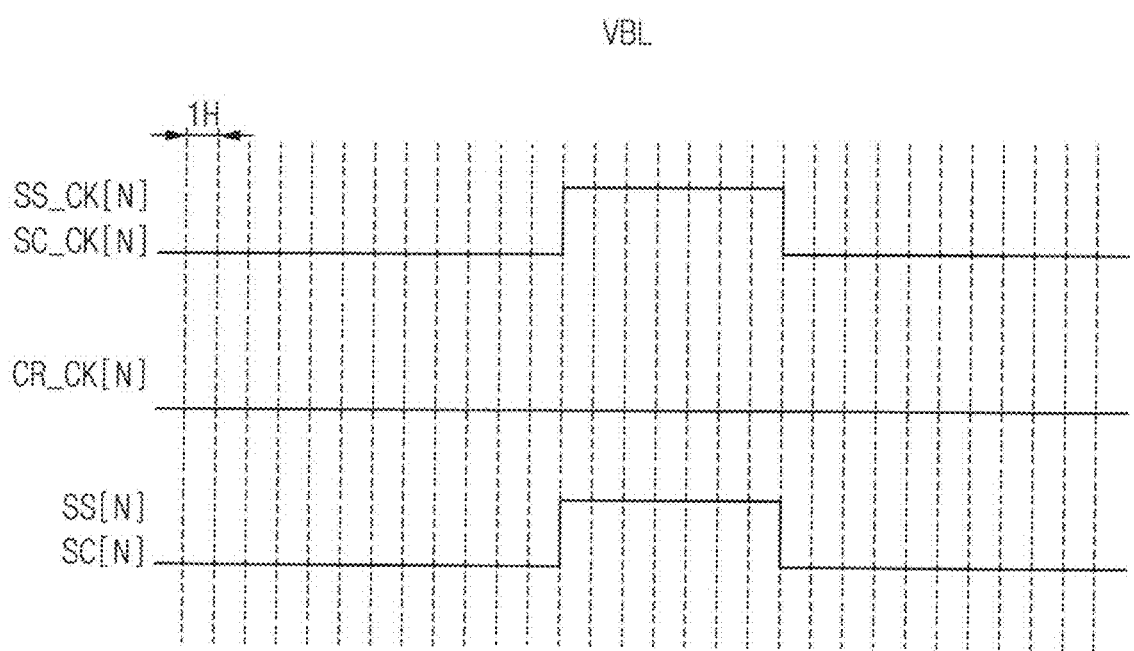
FIG. 7 is a timing diagram illustrating an example in which the display device of FIG. 1 operates in a blank period.

In an embodiment, at least one of the stages is selected, and each of the stages may include a sensing circuit 360 for applying the gate-on voltage to the first node N1 of the selected stage in the blank period (VBL in FIG. 7).

FIGS. 1, 4, and 5, the gate signals for driving one pixel row may be sequentially applied to the gate lines GL every one horizontal time period 1H during one frame. For example, the gate driver 300 may sequentially output the gate signals (i.e., the scan signal SC[N] and the sensing signal SS[N]) to the gate lines GL every one horizontal time period 1H.

An on-duty ratio of the scan signal SC[N] may be smaller than an on-duty ratio of the sensing signal SS[N]. For example, the carry clock signal CR_CK[N] and the sensing clock signal SS_CK[N] may each have a pulse of 2 horizontal time 2H every 6 horizontal times 6H. For example, the scan clock signal SC_CK[N] may have a pulse of a horizontal time less than 2 horizontal times 2H every 6 horizontal times 6H. However, the present invention is not limited thereto. For example, the carry clock signal CR_CK[N] and the sensing clock signal SS_CK[N] may each have a pulse of 1 horizontal time 1H (i.e., the scan clock signal SC_CK[N] may have a pulse of a horizontal time less than 1 horizontal time.) in another embodiment. For example, the carry clock signal CR_CK[N], the sensing clock signal SS_CK[N], and the scan clock signal SC_CK[N] may each have a pulse every 4 horizontal times 4H.

The previous carry signal CR[N−4] may be a carry signal generated in a fourth previous stage than the carry signal CR[N]. That is, a phase of the previous carry signal CR[N−4] may be different from a phase of the carry signal CR[N] by 4 horizontal times 4H. However, the present invention is not limited thereto. For example, the phase of the previous carry signal CR[N−4] may be different from the phase of the carry signal CR[N] by 2 horizontal times 2H in another embodiment.

The first next carry signal CR[N+4] may be a carry signal generated in a fourth next stage than the carry signal CR[N]. That is, the phase of the first next carry signal CR[N+4] may be different from the phase of the carry signal CR[N] by 4 horizontal times 4H. However, the present invention is not limited thereto. For example, the phase of the first next carry signal CR[N+4] may be different from the phase of the carry signal CR[N] by 2 horizontal times 2H in another embodiment.

The second next carry signal CR[N+2] may be a carry signal generated in a second previous stage than the first next carry signal CR[N+4]. That is, the phase of the second next carry signal CR[N+2] may be different from the phase of the first next carry signal CR[N+4] by 2 horizontal times 2H. However, the present invention is not limited thereto. For example, the phase of the second next carry signal CR[N+2] may be different from the phase of the first next carry signal CR[N+4] by 1 horizontal time H in another embodiment. For example, the start signal STV may have the gate-on level when a scan operation (i.e., an operation of applying the gate signals to the pixels P) starts in one frame. Accordingly, the start signal STV may be used as the previous carry signal CR[N−4] of the first stage (STAGE[1] in FIG. 3). Also, the fourth control part 244 may apply the second low power voltage VSS2 to the first node N1 in response to the start signal STV. Accordingly, when the scan operation starts, the gate driver 300 may discharge the voltage of the first node N1 of all stages.

Hereinafter, an operation of the stage STAGE[N] will be described.

At a first time point t1, the previous carry signal CR[N−4] may have the gate-on level, and the first input part 311 may apply the previous carry signal CR[N−4] of the gate-on level to the first node N1. Accordingly, the voltage of the first node N1 may increase. In addition, the voltage of the second node N2 may be decreased by the first control part 341, the second control part 342, and the third control part 343.

At a second time point t2, the carry clock signal CR_CK [N], the scan clock signal SC_CK[N], and the sensing clock signal SS_CK[N] may have the gate-on level. As the scan clock signal SC_CK[N] and the sensing clock signal SS_CK [N] increase from the gate-off level to the gate-on level, a voltage of the second electrode of the first capacitor C1 and a voltage of the second electrode of the second capacitor C2 may increase. Accordingly, the voltage of the first node N1 may further increase. And, the stage STAGE[N] may output the carry clock signal CR_CK[N] having the gate-on level, the scan clock signal SC_CK[N] having the gate-on level, and the sensing clock signal SS_CK[N] having the gate-on level as the carry signal CR[N], the scan signal SC[N], and the sensing signal SS[N], respectively.

At a third time point t3, the second next carry signal CR[N+2] may have the gate-on level, and the scan signal control part 330 may apply the first low power voltage VSS1 to the output terminal of the second output part 322. Accordingly, a falling time of the scan signal SC[N] may be reduced. However, FIG. 5 does not illustrate the falling time of signals.

At a fourth time t4, the first next carry signal CR[N+4] may have the gate-on level, and the second low power voltage VSS2 may be applied to the first node N1. Accordingly, the voltage of the first node N1 may decrease.

In an embodiment, the first scan control signal S1 may be the gate-on voltage.

The first scan control signal S1 may be applied to the second node N2 when the voltage of the first node N1 is the gate-off level. Accordingly, when the voltage of the first node N1 is the gate-off level, the voltage of the second node N2 may be the gate-on level.

In an embodiment, the second scan control signal S2 may be the gate-on voltage. The second scan control signal S2 may reduce leakage currents of the second input part 312, the second control part 342, and the fourth control part 244 when the voltage of the first node N1 is the gate-on level.

For example, when the voltage of the control electrode of the 6-1th transistor T6-1 is the gate-on level, a gate-source voltage of the 6-1th transistor T6-1 may be reduced. Accordingly, a leakage current flowing through the 6-1th transistor T6-1 may be reduced. This may be the same in the 11-1th transistor T11-1 and the 13-1th transistor T13-1.

In an embodiment, the first low power voltage VSS1 may be greater than the second low power voltage VSS2. In an embodiment, the third low power voltage VSS3 may be the same as the first low power voltage VSS1.

As described above, the output terminal of the first output part 321 may be not connected to a transistor other than the 2-1th transistor T2-1 and the 2-2th transistor T2-2, and the output terminal of the third output part 323 may be not connected to a transistor other than the 4-1th transistor T4-1 and the 4-2th transistor T4-2. Accordingly, the gate driver 300 may reduce the falling time of the scan signal SC[N]. And, the gate driver 300 may not include transistors for reducing the falling time of the sensing signal SS[N] and the carry signal CR[N] having relatively low necessity to reduce the falling time (A detailed description of this will be given later). Accordingly, a dead space and process defects of the display device 1000 may be reduced.

FIGS. 4 and 6, the scan signal control part 330 may reduce the falling time P1 of the scan signal SC[N]. Accordingly, the falling time P1 of the scan signal SC[N] may be smaller than the falling time P2 of the sensing signal SS[N]. For example, the falling time may be the time for a signal to decrease from the gate-on level to the gate-off level.

FIG. 7 is a timing diagram illustrating an example in which the display device 1000 of FIG. 1 operates in the blank period VBP. FIG. 7 is a diagram for the selected stage STAGE[N].

FIGS. 1, 4, and 7, the sensing selection signal SSS may select the pixels P (or pixel rows) sensed in every frame. For example, at least one stage STAGE[N] may be selected every frame. And, the display device 1000 may sense the pixels P for receiving signals from the selected stage STAGE [N].

The sensing circuit 360 may apply the gate-on voltage to the first node N1 of the selected stage STAGE[N]. Accordingly, the voltage of the first node N1 may increase.

The sensing clock signal SS_CK[N] and the scan clock signal SC_CK[N] may have the gate-on level. Accordingly, the stage STAGE[N] may output the scan clock signal SC_CK[N] and the sensing clock signal SS_CK[N] having the gate-on level as the scan signal SC[N] and the sensing signal SS[ N].

In the blank period VBP, the carry clock signal CR_CK [N] may have the gate-off level. In the blank period VBP, the scan signal SC[N] and the sensing signal SS[N] may be the same.

Figure 9:
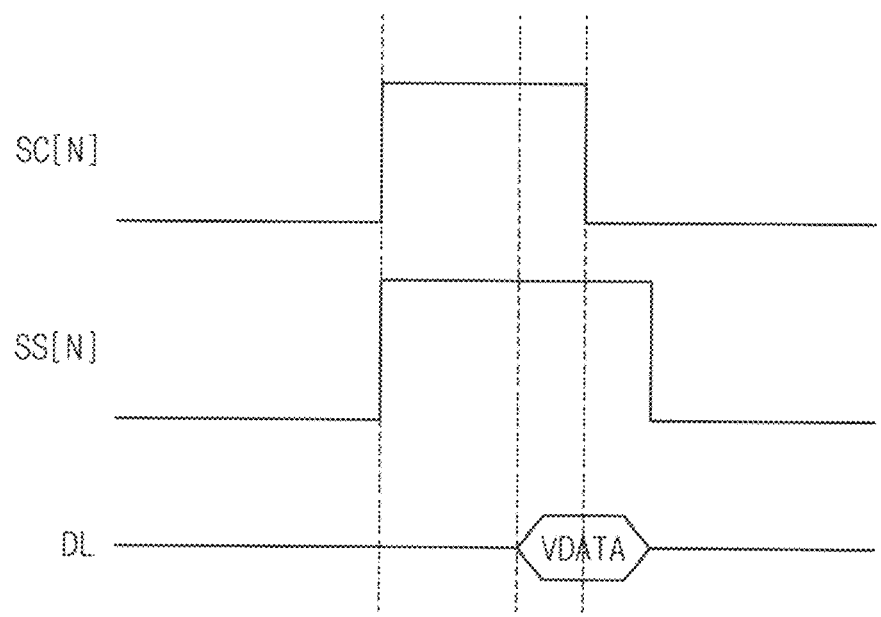
FIG. 9 is a timing diagram illustrating an example in which the display device of FIG. 1 operates in an active period.

FIG. 8 is a diagram illustrating an example of the pixel P of the display device 1000 of FIG. 1, and FIG. 9 is a timing diagram illustrating an example in which the display device 1000 of FIG. 1 operates in the active period ACTIVE.

Referring to FIGS. 1, 8, and 9, each of the pixels P may a write transistor WT including a control electrode for receiving the scan signal SC[N], a first electrode connected to the data line DL, and a second electrode connected to a fifth node N5, a storage capacitor CST including a first electrode connected to the fifth node N5 and a second electrode connected to a sixth node N6, a driving transistor DT including a control electrode connected to the fifth node N5, a first electrode for receiving a first power voltage ELVDD, and a second electrode connected to the sixth node N6, a sensing transistor ST including a control electrode for receiving the sensing signal SS[N], a first electrode connected to the sixth node N6, and a second electrode connected to the sensing line SL, and a light emitting element EE including a first electrode connected to the sixth node N6 and a second electrode for receiving a second power voltage ELVSS.

As shown in FIG. 8, the write transistor WT, the driving transistor DT, and the sensing transistor ST may be n-type transistors. However, the pixel P according to embodiments of the present invention is not limited thereto. For example, the write transistor WT, the driving transistor DT, and the sensing transistor ST may be p-type transistors.

For example, in the active period ACTIVE, the scan signal SC[N] and the sensing signal SS[N] may have the gate-on level, and the data voltage VDATA may be applied to the fifth node N5, an initialization voltage may be applied to the sixth node N6 (i.e., a data write operation). And, the scan signal SC[N] and the sensing signal SS[N] may have the gate-off level and a driving current corresponding to a voltage of the control electrode (i.e., the fifth node N5) of the driving transistor DT may be applied to the light emitting element EE (i.e., light emitting operation).

In order to maintain a voltage of the sixth node N6 as the initialization voltage while the data voltage VDATA is written to the storage capacitor CST, the scan signal SC[N] may have the gate-off level prior to the sensing signal SS[N]. Accordingly, the sensing signal SS[N] may have a lower need to reduce the falling time than the scan signal SC[N].

In an embodiment, in the blank period (VBL in FIG. 7), the scan signal SC[N] and the sensing signal SS[N] may have the gate-on level, and a reference voltage may be applied to the fifth node N5, and the initialization voltage may be applied to the sixth node N6. And, a driving current corresponding to the voltage of the control electrode (i.e., the fifth node N5) of the driving transistor DT may be applied to the data driver 400 through the sensing line SL (i.e., the sensing operation). The data driver 400 may generate the sensing data SD corresponding to a current value applied through the sensing line SL and may apply the sensing data SD to the timing controller 200. The timing controller 200 may compensate for the input image data IMG based on the sensing data SD.

Figure 10:
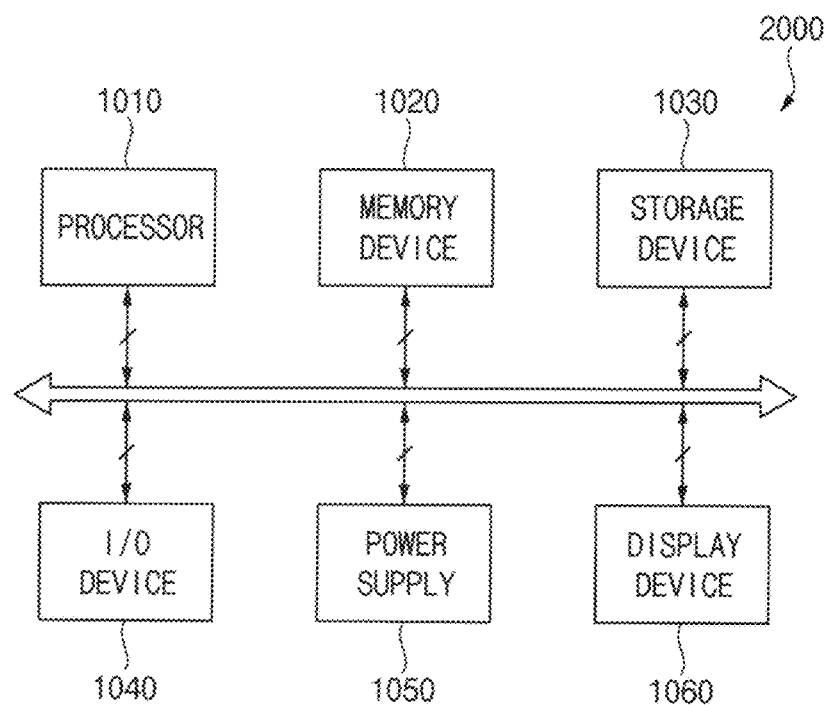
FIG. 10 is a block diagram showing an electronic device according to embodiments of the present invention.
Figure 11:
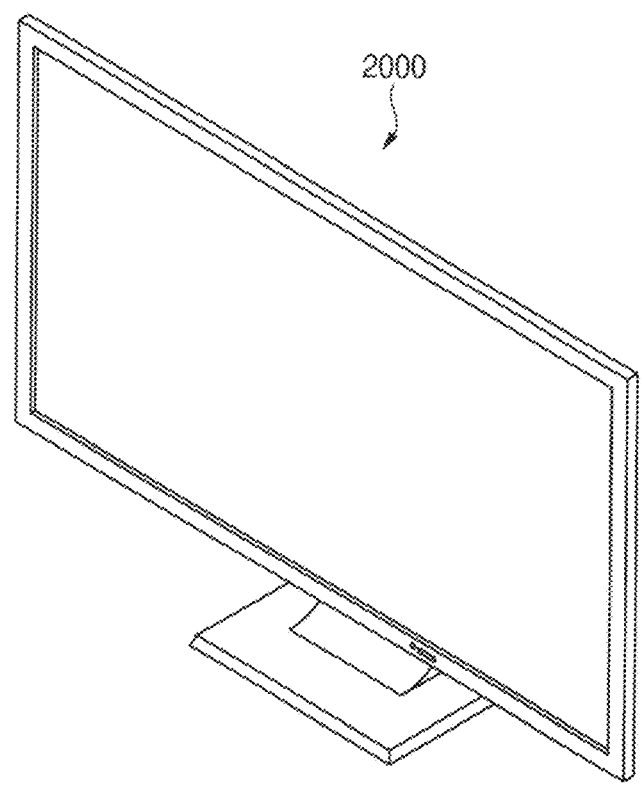
FIG. 11 is a diagram showing an example in which the electronic device of FIG. 11 is implemented as a television.

FIG. 10 is a block diagram showing an electronic device according to embodiments of the present invention, and FIG. 11 is a diagram showing an example in which the electronic device of FIG. 11 is implemented as a television.

Referring to FIGS. 10 and 11, the electronic device 2000 may include a processor 2010, a memory device 2020, a storage device 2030, an input/output ("I/O") device 2040, a power supply 2050, and a display device 2060. Here, the display device 2060 may be the display device 1000 of FIG. 1. In addition, the electronic device 2000 may further include a plurality of ports for communicating with a video card, a sound card, a memory card, a universal serial bus ("USB") device, other electronic devices, etc. In an embodiment, as shown in FIG. 11, the electronic device 2000 may be implemented as a television. However, the electronic device 2000 is not limited thereto. For example, the electronic device 2000 may be implemented as a cellular phone, a video phone, a smart pad, a smart watch, a tablet PC, a car navigation system, a computer monitor, a laptop, a head mounted display ("HMD") device, etc.

The processor 2010 may perform various computing functions. The processor 2010 may be a micro-processor, a central processing unit ("CPU"), an application processor ("AP"), etc. The processor 2010 may be coupled to other components via an address bus, a control bus, a data bus, etc. Further, the processor 2010 may be coupled to an extended bus such as a peripheral component interconnection ("PCI") bus.

The memory device 2020 may store data for operations of the electronic device 2000. For example, the memory device 2020 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc. and/or at least one volatile memory device such as a dynamic random access memory ("DRAM") device, a static random access memory ("SRAM") device, a mobile DRAM device, etc.

The storage device 2030 may include a solid state drive ("SSD") device, a hard disk drive ("HDD") device, a CD-ROM device, etc.

The I/O device 2040 may include an input device such as a keyboard, a keypad, a mouse device, a touch pad, a touch screen, etc., and an output device such as a printer, a speaker, etc. In some embodiments, the I/O device 2040 may include the display device 2060.

The power supply 2050 may provide power for operations of the electronic device 2000. For example, the power supply 2050 may be a power management integrated circuit ("PMIC").

The display device 2060 may display an image corresponding to visual information of the electronic device 2000. For example, the display device 2060 may be an organic light emitting display device or a quantum dot light emitting display device, but is not limited thereto. The display device 2060 may be coupled to other components via the buses or other communication links. Here, the display device 2060 may reduce the falling time of the scan signal. Accordingly, the display device may reduce an overlapping time of the scan signal output to different gate. And, the display device may reduce a dead space and process defects by not including a transistor for reducing the falling time of the sensing signal and/or the carry signal.

The inventions may be applied to any electronic device including the display device. For example, the inventions may be applied to a television ("TV"), a digital TV, a 3D TV, a mobile phone, a smart phone, a tablet computer, a virtual reality ("VR") device, a wearable electronic device, a personal computer ("PC"), a home appliance, a laptop computer, a personal digital assistant ("PDA"), a portable multimedia player ("PMP"), a digital camera, a music player, a portable game console, a navigation device, etc.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A gate driver comprising a plurality of stages, wherein each of the stages includes:
a first output part configured to output a carry signal in response to a voltage of a first node;
a first input part configured to control the voltage of the first node in response to a previous carry signal;
a second input part configured to control the voltage of the first node in response to a first next carry signal;
a second output part configured to output a scan signal in response to the voltage of the first node;
a third output part configured to output a sensing signal in response to the voltage of the first node; and
a scan signal control part configured to apply a first low power voltage to an output terminal of the second output part to which the scan signal is output in response to a second next carry signal of which a pulse is generated before a pulse of the first next carry signal,
wherein the first output part includes:
a 2-1th transistor including a control electrode connected to the first node, a first electrode configured to receive a carry clock signal, and a second electrode connected to an output terminal of the first output part; and
a 2-2th transistor including a control electrode connected to a second node, a first electrode configured to receive a second low power voltage, and a second electrode connected to the output terminal of the first output part,
wherein the second output part includes:
a 3-1th transistor including a control electrode connected to the first node, a first electrode configured to receive a scan clock signal, and a second electrode connected to the output terminal of the second output part; and
a 3-2th transistor including a control electrode connected to the second node, a first electrode configured to receive the first low power voltage, and a second electrode connected to the output terminal of the second output part, and
wherein the third output part includes:
a 4-1th transistor including a control electrode connected to the first node, a first electrode configured to receive a sensing clock signal, and a second electrode connected to an output terminal of the third output part; and
a 4-2th transistor including a control electrode connected to the second node, a first electrode configured to receive the first low power voltage, and a second electrode connected to the output terminal of the third output part,
wherein the output terminal of the first output part is directly connected to only-the 2-1th transistor and the 2-2th transistor, and
wherein the output terminal of the third output part is directly connected to only the 4-1th transistor and the 4-2th transistor.

2. The gate driver of claim 1, wherein the scan signal control part includes:
a first transistor including a control electrode configured to receive the second next carry signal, a first electrode configured to receive the first low power voltage, and a second electrode connected to the output terminal of the second output part.

3. The gate driver of claim 1, wherein the first low power voltage is greater than the second low power voltage.

4. The gate driver of claim 1, wherein the second output part further includes:
a first capacitor including a first electrode connected to the first node and a second electrode connected to the output terminal of the second output part, and
wherein the third output part further includes:
a second capacitor including a first electrode connected to the first node and a second electrode connected to the output terminal of the third output part.

5. The gate driver of claim 1, wherein the first input part includes:
a 5-1th transistor including a control electrode configured to receive the previous carry signal, a first electrode configured to receive the previous carry signal, and a second electrode connected to a third node; and
a 5-2th transistor including a control electrode configured to receive the previous carry signal, a first electrode connected to the third node, and a second electrode connected to the first node, and
wherein the second input part includes:
a 6-1th transistor including a control electrode configured to receive the first next carry signal, a first electrode connected to the third node, and a second electrode connected to the first node; and
a 6-2th transistor including a control electrode configured to receive the first next carry signal, a first electrode configured to receive the second low power voltage, and a second electrode connected to the third node.

6. The gate driver of claim 5, wherein each of the stages further includes:
a first control part configured to control a voltage of the second node in response to the voltage of the first node;
a second control part configured to control the voltage of the first node in response to the voltage of the second node; and
a third control part configured to control the voltage of the second node in response to the previous carry signal.

7. The gate driver of claim 6, wherein each of the stages further includes:
a fourth control part configured to control the voltage of the first node in response to a start signal.

8. The gate driver of claim 7, wherein the first control part includes:
a 7-1th transistor including a control electrode configured to receive a first scan control signal, a first electrode configured to receive the first scan control signal, and a second electrode connected to a first electrode of a 7-2th transistor;
the 7-2th transistor including a control electrode configured to receive the first scan control signal, the first electrode connected to the second electrode of the 7-1th transistor, and a second electrode connected to a fourth node;
an eighth transistor including a control electrode connected to the fourth node, a first electrode configured to receive the first scan control signal, and a second electrode connected to the second node;
a ninth transistor including a control electrode connected to the first node, a first electrode configured to receive a third low power voltage, and a second electrode connected to the fourth node; and a tenth transistor including a control electrode connected to the first node, a first electrode configured to receive the second low power voltage, and a second electrode connected to the second node.

9. The gate driver of claim 8, wherein the third low power voltage is the same as the first low power voltage.

10. The gate driver of claim 8, wherein the first scan control signal is a gate-on voltage.

11. The gate driver of claim 8, wherein the second control part includes:
an 11-1th transistor including a control electrode connected to the second node, a first electrode connected to the third node, and a second electrode connected to the first node; and
an 11-2th transistor including a control electrode connected to the second node, a first electrode configured to receive the second low power voltage, and a second electrode connected to the third node,
wherein the third control part includes:
a twelfth transistor including a control electrode configured to receive the previous carry signal, a first electrode configured to receive the second low power voltage, and a second electrode connected to the second node, and
wherein the fourth control part includes:
a 13-1th transistor including a control electrode configured to receive the start signal, a first electrode connected to the third node, and a second electrode connected to the first node; and
a 13-2th transistor including a control electrode configured to receive the start signal, a first electrode configured to receive the second low power voltage, and a second electrode connected to the third node.

12. The gate driver of claim 11, wherein each of the stages further includes:
a leakage control part configured to apply a second scan control signal to the third node in response to the voltage of the first node.

13. The gate driver of claim 12, wherein the second scan control signal is a gate-on voltage.

14. The gate driver of claim 12, wherein the leakage control part includes:
a 14-1th transistor including a control electrode connected to the first node, a first electrode configured to receive the second scan control signal, and a second electrode connected to a first electrode of a 14-2th transistor; and
the 14-2th transistor including a control electrode connected to the first node, the first electrode connected to the second electrode of the 14-1th transistor, and a second electrode connected to the third node.

15. The gate driver of claim 1, wherein at least one of the stages is selected, and
wherein each of the stages includes a sensing circuit configured to apply a gate-on voltage to the first node of the selected stage in a blank period.

16. The gate driver of claim 1, wherein an on-duty ratio of the scan signal is smaller than an on-duty ratio of the sensing signal.

17. A display device comprising:
a display panel including pixels connected to data lines;
a gate driver including a plurality of stages;
a data driver configured to apply data voltages to the pixels; and
a timing controller configured to control the gate driver and the data driver, wherein each of the stages includes:
a first output part configured to output a carry signal in response to a voltage of a first node;
a first input part configured to control the voltage of the first node in response to a previous carry signal;
a second input part configured to control the voltage of the first node in response to a first next carry signal;
a second output part configured to output a scan signal in response to the voltage of the first node;
a third output part configured to output a sensing signal in response to the voltage of the first node; and
a scan signal control part configured to apply a first low power voltage to an output terminal of the second output part to which the scan signal is output in response to a second next carry signal of which a pulse is generated before a pulse of the first next carry signal,
wherein the first output part includes:
a 2-1th transistor including a control electrode connected to the first node, a first electrode configured to receive a carry clock signal, and a second electrode connected to an output terminal of the first output part; and
a 2-2th transistor including a control electrode connected to a second node, a first electrode configured to receive a second low power voltage, and a second electrode connected to the output terminal of the first output part,
wherein the second output part includes:
a 3-1th transistor including a control electrode connected to the first node, a first electrode configured to receive a scan clock signal, and a second electrode connected to the output terminal of the second output part; and
a 3-2th transistor including a control electrode connected to the second node, a first electrode configured to receive the first low power voltage, and a second electrode connected to the output terminal of the second output part, and
wherein the third output part includes:
a 4-1th transistor including a control electrode connected to the first node, a first electrode configured to receive a sensing clock signal, and a second electrode connected to an output terminal of the third output part; and
a 4-2th transistor including a control electrode connected to the second node, a first electrode configured to receive the first low power voltage, and a second electrode connected to the output terminal of the third output part,
wherein the output terminal of the first output part is directly connected to only the 2-1th transistor and the 2-2th transistor, and
wherein the output terminal of the third output part is directly connected to only the 4-1th transistor and the 4-2th transistor.

18. The display device of claim 17, wherein each of the pixels includes:
a driving transistor including a control electrode connected to a fifth node, a first electrode configured to receive a first power voltage, and a second electrode connected to a sixth node;
a write transistor including a control electrode configured to receive the scan signal, a first electrode configured to receive a corresponding data voltage of the data voltages, and a second electrode connected to the fifth node;
a sensing transistor including a control electrode configured to receive the sensing signal, a first electrode connected to a sensing line, and a second electrode connected to the sixth node;

a storage capacitor including a first electrode connected to the fifth node and a second electrode connected to the sixth node; and a light emitting element including a first electrode connected to the sixth node and a second electrode configured to receive a second power voltage.

* * * * *